(12) United States Patent
Bose et al.

(10) Patent No.: US 11,258,296 B1
(45) Date of Patent: Feb. 22, 2022

(54) SHARED RESONANT TURN OFF CIRCUIT

(71) Applicant: ABB Schweiz AG, Baden (CH)

(72) Inventors: Veerakumar Bose, Richmond, VA (US); Thomas Kendzia, III, Henrico, VA (US); Christopher Alan Belcastro, Mechanicsville, VA (US); Harshang Shah, Bloomfield, CT (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/100,040

(22) Filed: Nov. 20, 2020

(51) Int. Cl.
*H02J 1/00* (2006.01)
*H02J 3/00* (2006.01)
*H02J 9/06* (2006.01)

(52) U.S. Cl.
CPC ............ *H02J 9/062* (2013.01); *H02J 3/0012* (2020.01)

(58) Field of Classification Search
CPC ................................ H02J 9/062; H02J 3/0012
USPC ............................................................ 307/86
See application file for complete search history.

(56) References Cited

U.S. PATENT DOCUMENTS

| | | |
|---|---|---|
| 4,190,743 A | 2/1980 | Hugel et al. |
| 4,210,846 A | 7/1980 | Capewell et al. |
| 4,455,597 A | 6/1984 | Vukasovic |
| 5,343,140 A | 8/1994 | Gegner |
| 5,436,786 A | 7/1995 | Pelly et al. |
| 5,689,164 A | 11/1997 | Hoft et al. |
| 5,694,007 A | 12/1997 | Chen |
| 5,770,897 A | 6/1998 | Bapat et al. |
| 6,118,676 A | 9/2000 | Divan et al. |
| 6,317,346 B1 | 11/2001 | Early |
| 6,560,128 B1 | 5/2003 | Rajda et al. |
| 7,459,804 B2 | 12/2008 | Marwali et al. |
| 7,589,438 B2 | 9/2009 | Galm |
| 8,508,890 B2 | 8/2013 | Zheng et al. |
| 9,467,112 B2 | 10/2016 | English et al. |
| 2004/0070278 A1 | 4/2004 | Divan et al. |
| 2006/0226706 A1 | 10/2006 | Edelen et al. |
| 2010/0264743 A1 | 10/2010 | Jung et al. |
| 2011/0205675 A1 | 8/2011 | Divan |
| 2012/0091979 A1 | 4/2012 | Jovcic |

(Continued)

FOREIGN PATENT DOCUMENTS

| | | |
|---|---|---|
| CN | 101540493 B | 1/2011 |
| EP | 3240004 A1 | 11/2017 |

(Continued)

OTHER PUBLICATIONS

Lonneker, Michael, et al., "A Novel Space Vector Modulation Strategy for Thyristor Matrix Converters", EPE-ECCE 2013, Lillie, Frankreich, Sep. 2013 (10 pp).

(Continued)

*Primary Examiner* — Richard Tan
(74) *Attorney, Agent, or Firm* — Greenberg Traurig, LLP

(57) ABSTRACT

A static transfer switch is provided for supplying power to a load alternately from two different power sources. Switching between the two power sources may occur within a fraction of one electrical cycle. In response to sensing degraded performance in the power source supplying the load, a main circuit is turned off with a resonant turn off circuit. The resonant turn off circuit is shared between the main circuits of two different power sources such that the resonant turn off circuit is connected to the main circuit of whichever power source is currently supply power to the load.

20 Claims, 14 Drawing Sheets

(56) References Cited

U.S. PATENT DOCUMENTS

| | | | |
|---|---|---|---|
| 2014/0028110 A1 | 1/2014 | Petersen et al. | |
| 2014/0029313 A1 | 1/2014 | Telefus | |
| 2014/0039711 A1* | 2/2014 | Divan | H02J 3/005 700/291 |
| 2014/0097690 A1 | 4/2014 | Costa et al. | |
| 2014/0132080 A1 | 5/2014 | Bush et al. | |
| 2014/0254223 A1 | 9/2014 | Limpaecher | |
| 2014/0292105 A1 | 10/2014 | Hsieh | |
| 2016/0182037 A1 | 6/2016 | Srihari et al. | |
| 2016/0197517 A1 | 7/2016 | Bundschuh et al. | |
| 2016/0218557 A1 | 7/2016 | Cinti et al. | |
| 2017/0117748 A1 | 4/2017 | Mondal | |
| 2017/0126006 A1 | 5/2017 | Pfitzer et al. | |
| 2017/0178844 A1 | 6/2017 | Angquist et al. | |
| 2019/0372389 A1 | 12/2019 | Pan et al. | |

FOREIGN PATENT DOCUMENTS

| | | |
|---|---|---|
| WO | 2005083864 A2 | 9/2005 |
| WO | 2012104580 A2 | 8/2012 |
| WO | 2014177874 A2 | 11/2014 |
| WO | 2017074706 A1 | 5/2017 |

OTHER PUBLICATIONS

ABB Product Brochure, "Cyberex SuperSwitch 3 technology 200-4000A digital static transfer switch", 2015 (8 pp).

Chen, Po-Tai, et al., "Design of an Impulse Commutation Bridge for the Solid-State Transfer Switch", IEEE Transactions on Industry Applications, vol. 44, No. 4, Jul./Aug. 2008 (10 pp).

ABB White Paper, "Preventing transformer saturation in static transfer switches a Real Time Flux Control Method", WP031918, WP-STS-MK-0074, 2018 (12 pp).

ABB Product Brochure, "Cyberex SuperSwitch 4 technology 200A-2000A digital static transfer switch", BRO-STS-MK-0073 091318, 2018 (8 pp).

ABB Product Datasheet, "Cyberrex Power Distribution Unit (PDU) Power distribution system", BRO-PDU-MK-0020, 2018 (4 pp).

Leuer, Michael, et al., "Model Predictive Control Strategy for Multi-Phase Thyristor Matrix Converters—Advantages, Problems and Solutions", Paderborn University, 18th European Conference on Power Electronics and Applications (EPE 2016), Karlsruhe, Germany, 2016 (10 pp).

Leuer, Michael, et al., "Direct Model Predictive Control Strategy for Multi-Phase Thyristor Matrix Converters", Paderborn University, IEEE 2015 (6 pp).

Meyer, Christph, et al., "Solid-State Circuit Breaker Based on Active Thyristor Topologies", IEEE Transactions on Power Electronics, vol. 21, No. 2, Mar. 2006 (9 pp).

Lu, Yan, et al., "A 13.56 Mhz CMOS Active Rectifier With Switched-offset and Compensated Biasing for Biomedical Wireless Power Transfer Systems", IEEE Transactions on Biomedical Circuits and Systems, vol. 8, No. 3, Jun. 2014 (11 pp).

* cited by examiner

US 11,258,296 B1

SHARED RESONANT TURN OFF CIRCUIT

BACKGROUND

The present inventions relate generally to a static transfer switch for transferring power from one power source to another power source to supply an electrical load.

Static transfer switches are used in the industry to control the electrical power supply to critical electrical components. In particular, static transfer switches are used for electrical loads like data centers where a constant, high-quality electrical supply is required.

An example of a static transfer switch 10 is shown in FIG. 1. As shown, two different electrical power sources 12A, 12B are coupled to the static transfer switch 10. The output of the static transfer switch 10 is coupled to an electrical load 14. Typically, the output is directly connected to a Power Distribution Unit (PDU) 14, which includes a transformer 16. The final electrical load may be racks of computer servers 30 (FIG. 2) in a data center. However, it is understood that static transfer switches 10 may also be used to supply power to other types of electrical loads.

The static transfer switch 10 may include a variety of sensors 18A, 18B, 20A, 20B to monitor electrical properties of the first and second power sources 12A, 12B and the power output. For example, it may be desirable to monitor the voltage 18A, 18B of each of the power sources 12A, 12B and to monitor current 20A and voltage 20B of the output. The static transfer switch 10 also includes one or more switches 22A, 22B associated with each of the power sources 12A, 12B. This allows the static transfer switch 10 to supply power to the output from either of the power sources 12A, 12B. For example, the first power source 12A may be the preferred power source 12A (e.g., the grid), and the second power source 12B may be a backup power source 12B (e.g., a generator). In normal use, power can be supplied from the first power source 12A to the load 14 by closing the first switch 22A and opening the second switch 22B (to disconnect the second power source 12B). In the event that the first power source 12A suffers from degraded performance (e.g., drop in voltage) as determined from one or more of the sensors 18A, 18B, 20A, 20B, the power supply can be transferred to the second power source 12B by opening the first switch 22A and closing the second switch 22B. Thus, the electrical load 14 is provided with a constant source of power despite the possibility of degraded performance events in one of the power sources 12A, 12B.

SUMMARY

A static transfer switch is described for increasing the speed of switching from one power source to another power source. The system senses degraded performance of the power source supplying power to the load. In response to sensing degraded performance, the system turns off a gate signal to a first switch coupled between the power source and the load. The system also includes a resonant turn off circuit which forces the first switch to open during a switching event. The resonant turn off circuit is shared between the first switch associated with the first power source and a second switch associated with a second power source. The resonant turn off circuit can be selectively connected to either the first or second switch depending on which power source is supplying power to the load. The invention may also include any other aspect described below in the written description or in the attached drawings and any combinations thereof.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
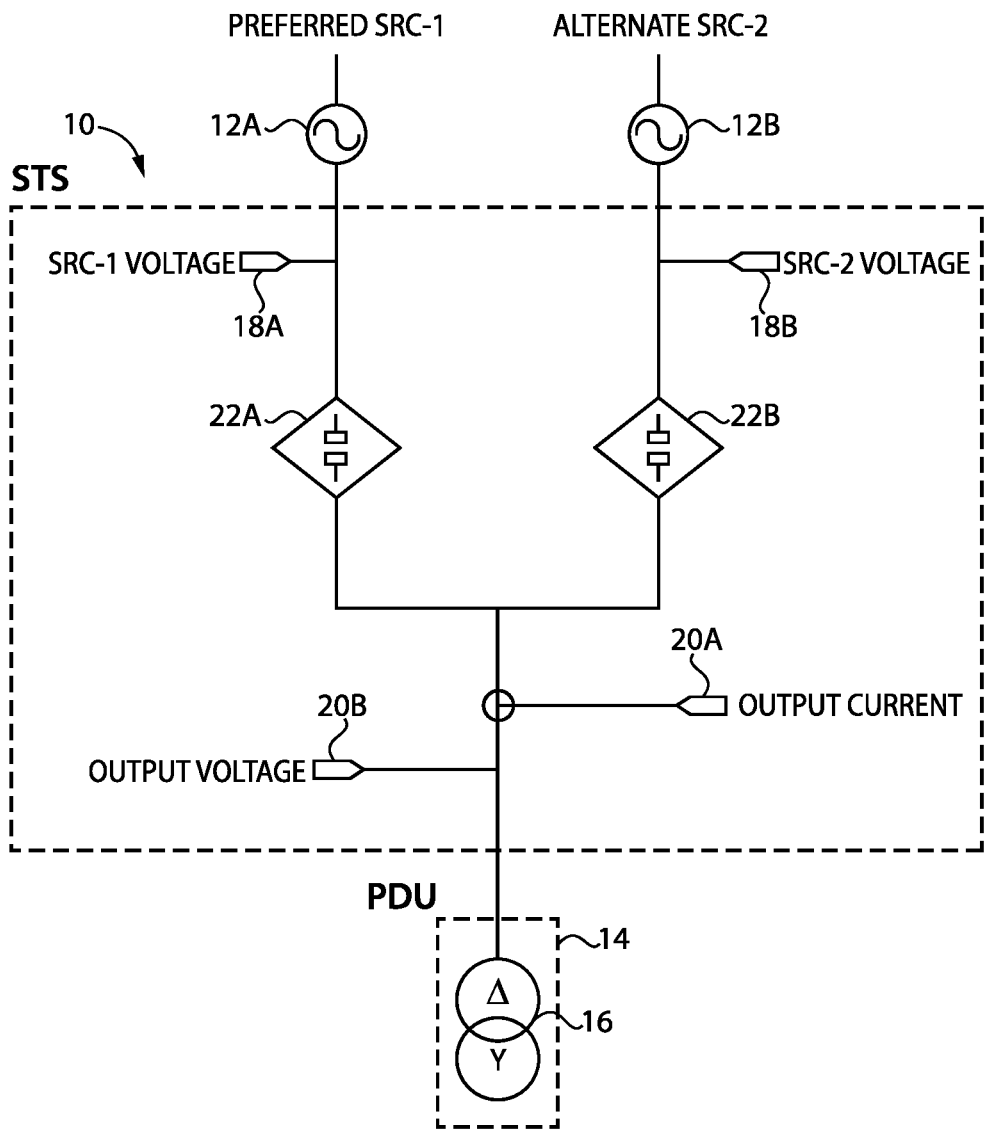
FIG. 1 is a schematic of a static transfer switch.
Figure 2:
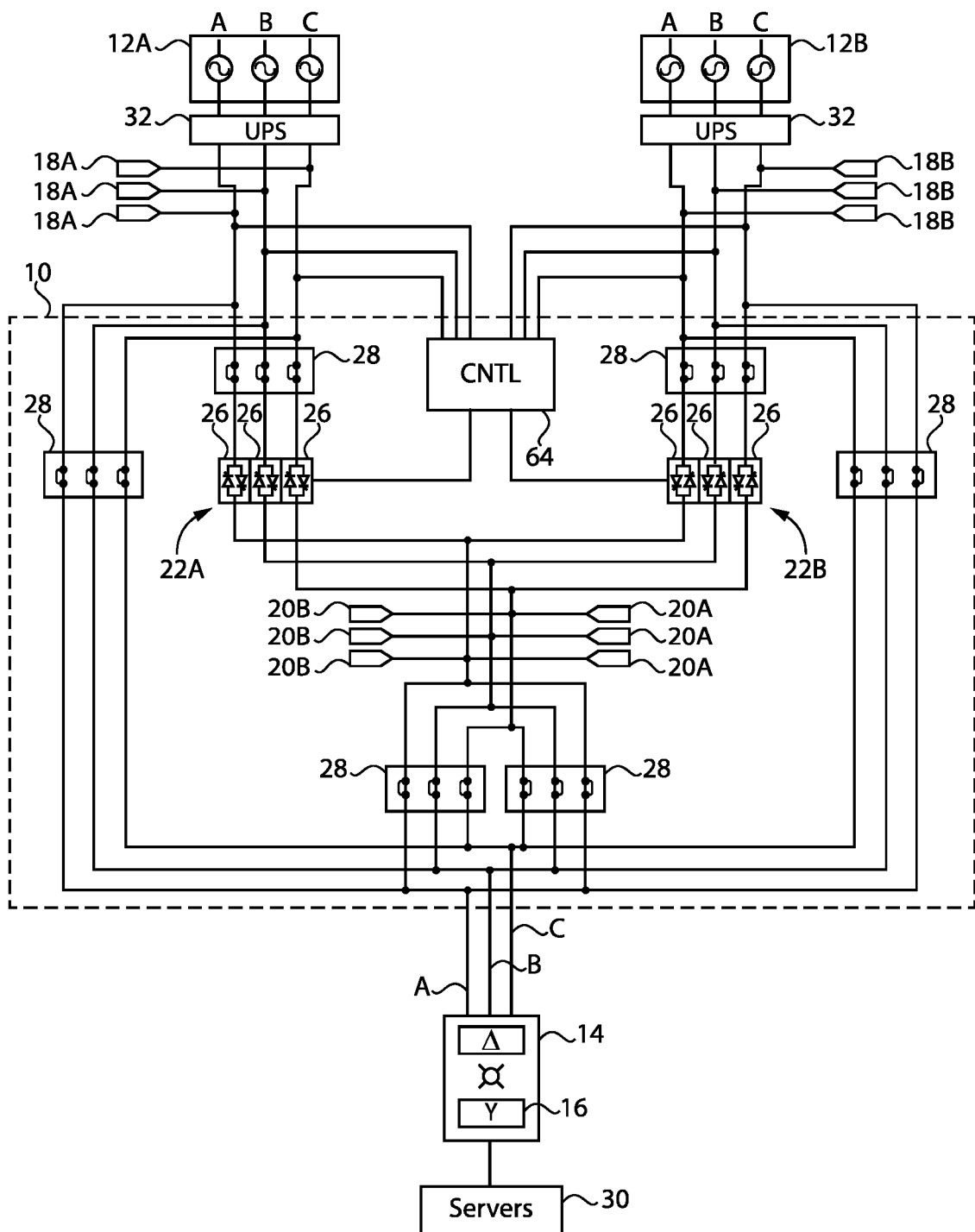
FIG. 2 is a schematic of the static transfer switch showing three-phase power sources and a three-phase load.

An example of a three-phase static transfer switch 10 is shown in FIG. 2. Typically, static transfer switches 10 are designed to complete a switching event between the two power sources 12A, 12B within one electrical cycle of the power sources 12A, 12B. This is desirable so that a high-quality, constant power supply is provided with minimal effect on the electrical load 14, 30. In order to achieve switching events this quickly, it is typically necessary to use solid-state switches 22A, 22B (first switches 22A and second switches 22B) to perform the switching event since solid-state switches 22A, 22B can be switched on and off in less than one electrical cycle. Preferably, the switches 22A, 22B are silicon controlled rectifiers (SCR). Various types of thyristors may be used for the solid-state switches 22A, 22B, such as integrated gate-commutated thyristors (IGCT), reverse blocking integrated gate-commutated thyristors (RB-IGCT), or gate turn-off thyristors (GTO). In the case of a multiphase static transfer switch 10, each of the main switches 22A, 22B will be made up of multiple individual switches 26, with at least one switch 26 for each phase A, B, C. A pair of anti-parallel thyristors 26 is particularly well-suited for each switch 26 associated with a phase A, B, C. Because the power sources 12A, 12B are AC power sources, each switch 26 typically includes two switches 26A, 26B in an anti-parallel arrangement. However, each pair of anti-parallel thyristors 26A, 26B are often treated as a single switch 26 because they typically turn on and off together.

The static transfer switch 10 may also include a series of manual switches 28 that are primarily used during maintenance to isolate sections of the circuit.

It is often preferred for the first and/or second power sources 12A, 12B to include an uninterruptible power supply (UPS) 32 to provide control over the electrical properties of the original source 12A, 12B and manage power drops or losses in the original source 12A, 12B. As noted, the output is typically coupled to the transformer 16 of a PDU 14, and the final electrical load 30 is often racks of computer servers 30 in a data center.

An improvement of the invention herein is that it uses a resonant turn off topology adjusted to force commutate a three-phase power system and is operated by an embedded digital processor controlling the signals with software intelligence and algorithms in order to achieve autonomy and make possible a sub-millisecond transfer switch.

Figure 3:
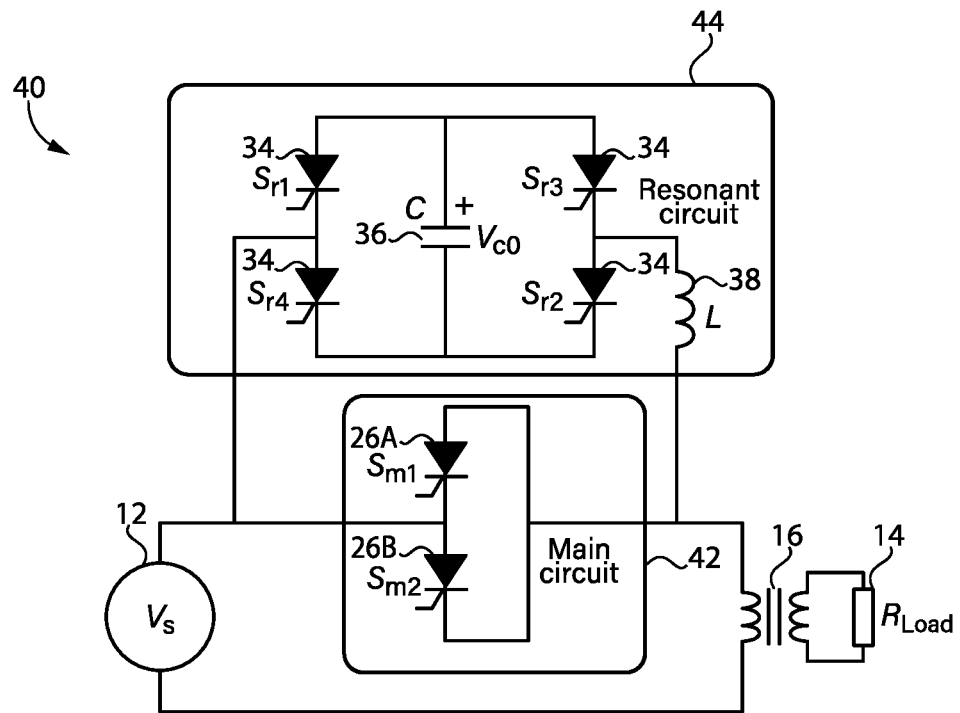
FIG. 3 is a schematic of a switch circuit coupled between one phase of the power source and the load.

The turn off circuit 40 with RTO topology is shown in FIG. 3. As shown, the circuit 40 includes a main circuit 42 and a resonant circuit 44. The main thyristors 26A, 26B (first switches) are $S_{m1}$ and $S_{m2}$. The resonant circuit includes four auxiliary thyristor switches 34 (third switches) $S_{r1}$, $S_{r2}$, $S_{r3}$, $S_{r4}$, resonant capacitor C (energy storage) 36, and resonant inductor L 38. The capacitor C 36 is pre-charged to provide resonant current to create a zero-current crossing for the main thyristors 26. The inductor L 38 limits di/dt for main thyristors 26 during turn-off. During normal conduction, only the main thyristors $S_{m1}$ (or $S_{m2}$) 26A, 26B are conducting and all the auxiliary switches 34 are off. Thus, the pre-charged resonant capacitor 36 is isolated from the main thyristor switches 26. In resonant turn-off operation, the auxiliary switches 34 $S_{r1,2}$ (or $S_{r3,4}$ depending on current direction) are triggered to open by sending a gate signal thereto. As a result, the energy stored in the resonant capacitor 36 is discharged. When the resonant current through the inductor 38 L exceeds the load current, the current through the main thyristor 26 is commuted to the resonant circuit. In the meantime, the capacitor 36 voltage provides a negative bias voltage to help the main thyristor 26 turn off (i.e., open and stop conducting). When the main thyristor 26 current reaches zero, it starts turning off with reverse bias voltage from the resonant capacitor 36. In the RTO topology, there are three possible design choices to control performance: resonant capacitance value C, pre-charged initial capacitor voltage $V_{c0}$, and resonant inductance value L. These parameters can be used to determine how much and how fast the main thyristor current can be turned off, as well as the size and cost of the auxiliary resonant circuit.

Figure 4:
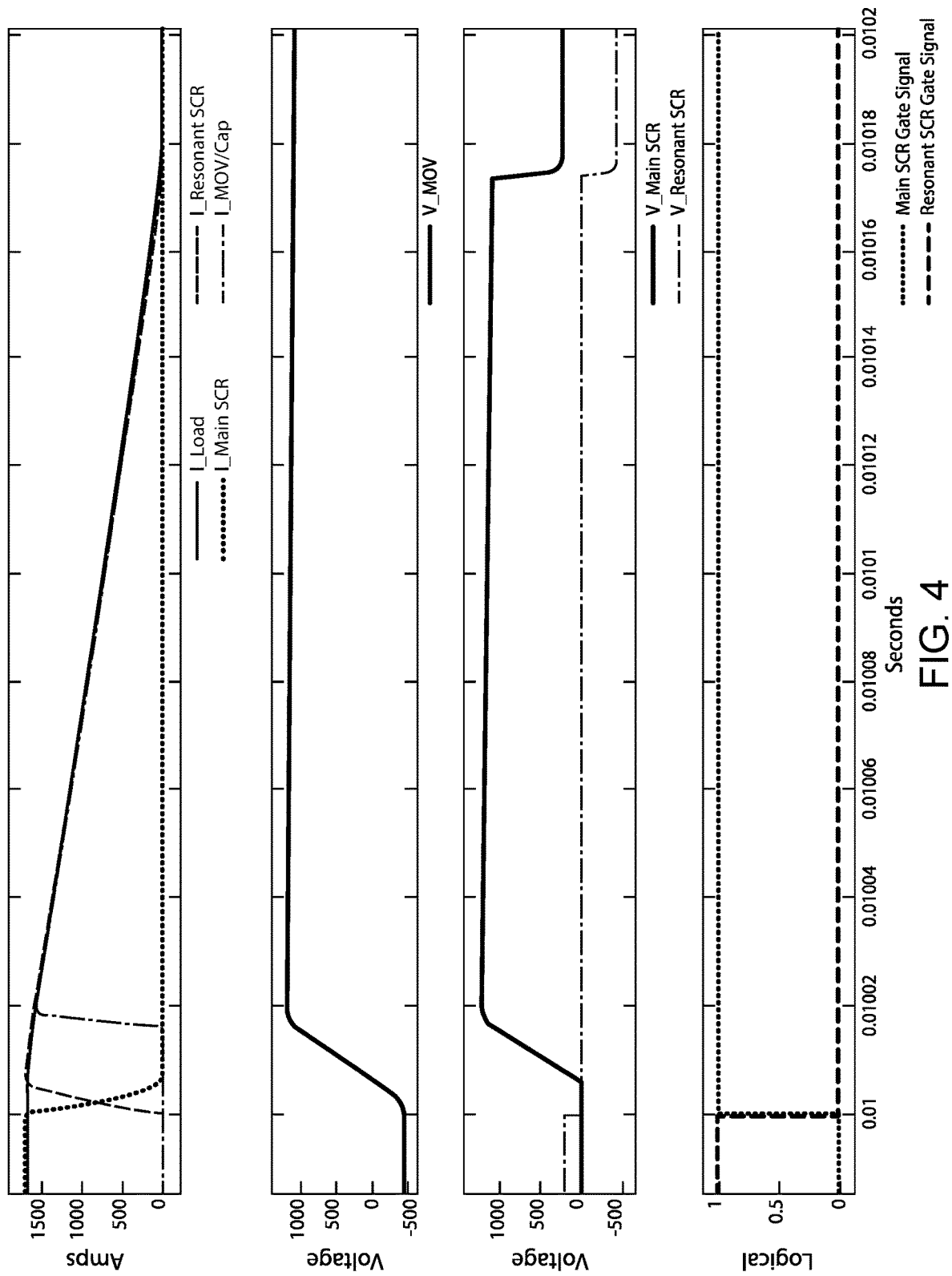
FIG. 4 is a series of graphs showing electrical properties of the switch circuit during opening of the switch between the power source and the load.

FIG. 4 shows the voltage and current waveforms of resonant turn-off operation for the main thyristors 26 and auxiliary switches 34. As shown in the bottom graph, at time 0.1 seconds a gate signal is sent to turn off the main thyristor 26, and a gate signal is sent to turn on the auxiliary thyristors 34. This occurs as a result of degraded performance being identified by a sensor 18, 20. Because the second switches 22B cannot be closed to switch power to the second power source 12B until the first switches 22A have been opened, it would be beneficial to be able to stop current conduction through the first switches 22A faster than in a conventional static transfer switch. That is, once a turn on gate signal has been applied to an SCR, current will continue to be conducted through the SCR even after a turn off gate signal is applied. However, after a turn off gate signal is applied to the SCR, the SCR will stop conducting current after the current drops below a threshold. That normally occurs with an AC current when the current waveform crosses zero. However, that may require up to half of an AC cycle for the power source waveform to cross zero (i.e., 8 ms). It would be beneficial to be able to stop the first switches 26A quicker so that the second switches can be closed more quickly to transfer power as quick as possible from the first power source 12A to the second power source 12B. As shown in the top graph in FIG. 4, current to the load 14, 16 through the main and auxiliary thyristors 26, 34 stops in less than 0.18 ms after applying the gate signals to the main and auxiliary thyristors 26, 34, and preferably within 0.5 ms. Thus, the turn off speed is greatly increased.

Referring to FIG. 4, after the auxiliary resonant thyristors 34 are triggered, the resonance starts and the resonant current through L 38 increases fast. Once the resonant current is larger than the load 14, 16 current, the main thyristor 26 current decreases to zero and starts turning off. In the meanwhile, the load 14, 16 current is commutated or bypassed to the auxiliary circuit 44 (34, 36, 38). The resonant capacitor 36 is re-charged by the load 14, 16 current but in reversed voltage polarity. After the resonant capacitor 36 voltage is high enough and the load 14, 16 current is interrupted, the auxiliary thyristors 34 are turned off. As a result, the RTO has disconnected the first power source 12A and the load 14, 16 is ready to be transferred to the alternative power source 12B.

Figure 5:
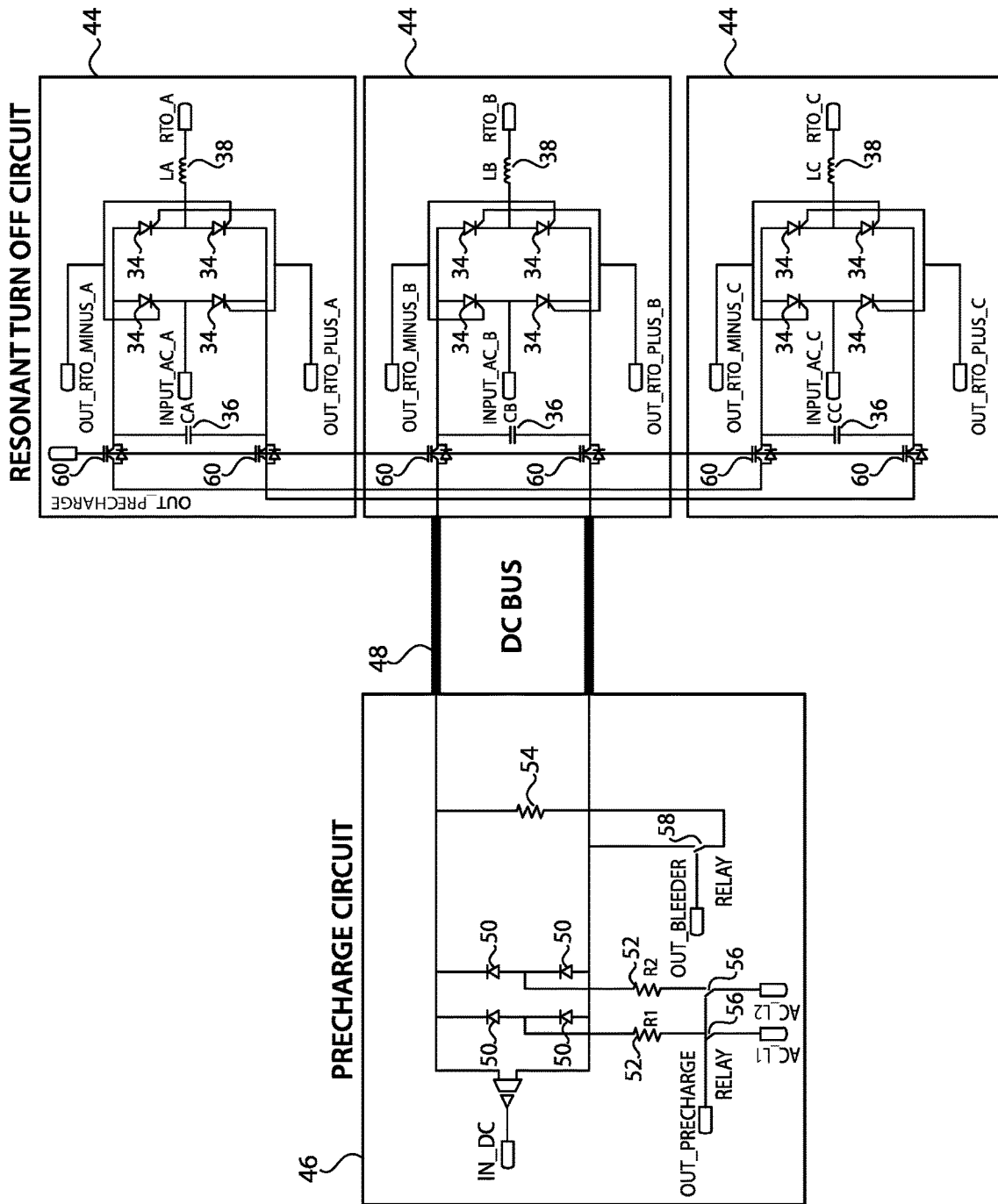
FIG. 5 is a schematic of a charge circuit for the energy storages.

The resonant circuits 44 (one for each phase) are shown in FIG. 5. As shown, a pre-charge circuit 46 is coupled to the resonant circuits 44 with a DC bus 48. Preferably, the DC bus 48 is pre-charged slowly through the single bridge rectifier diodes 50 with resistors 52 to make sure capacitive inrush is prevented. Also, in case the DC bus 48 runs above the set limit, a bleeding resistor 54 can be used to adjust that DC level to the desired value. A pre-charge relay 56 and bleed relay 58 are used to turn on and off the pre-charging and bleeding. Preferably, a fourth switch 60 is provided between the pre-charge circuit 46 and the capacitors 36 to disconnect the pre-charge circuit 46 from the capacitors. The fourth switch 60 is preferably opened to stop charging of the capacitors in response to the switching event. If desired, fourth switches 60 may be provided for each resonant circuit 44 to disconnect the respective circuit 44 from the DC bus 48.

A phase locked loop (PLL) 62 (see FIG. 9) is used to determine the frequency and phase angle of the AC waveform of the power source 12A. The PLL 62 can be used in determining the firing sequence for the auxiliary switches 34 because the switches 34 need to be fired at the correct polarity. Since this is a three-phase system, the polarity of phase A, phase B and phase C will not be the same at the same time. The firing sequence is determined by the following algorithm:

IF 0<=PLL_RADIAN [PHASE_A]<=π
Turn ON OUT_RTO_PLUS_A
Turn OFF OUT_RTO_MINUS_A
ELSE
Turn ON OUT_RTO_MINUS_A
Turn OFF OUT_RTO_PLUS_A The same algorithm is applied for the other remaining phases to complete the firing sequence in case a transfer is needed. In other words, only two of the auxiliary switches 34 are turned on to release current from the capacitor 36, with one switch 34 being coupled to the input of the main thyristors 26 and the other switch 34 being coupled to the output of the main thyristors 26. The two auxiliary switches 34 that are turned on depends on current flow of the AC current through the main switches 26. Thus, when the current is positive, one pair of switches 34 will be turned on (while the other pair remains off), and when the current is negative, the other pair of switches 34 will be turned on (again, with the other pair remaining off). Preferably, all of the main switches 22A, 26 are turned off (i.e., opened) and the auxiliary switches 34 are turned on (i.e., closed) at the same time in the static transfer switch 10. Because some phases A, B, C will have a positive current and some phases A, B, C will have a negative current at the switching instant, the pair of auxiliary switches 34 that is closed in each phase resonant circuit 44 will vary depending on the current of the particular phase A, B, C.

Figure 6:
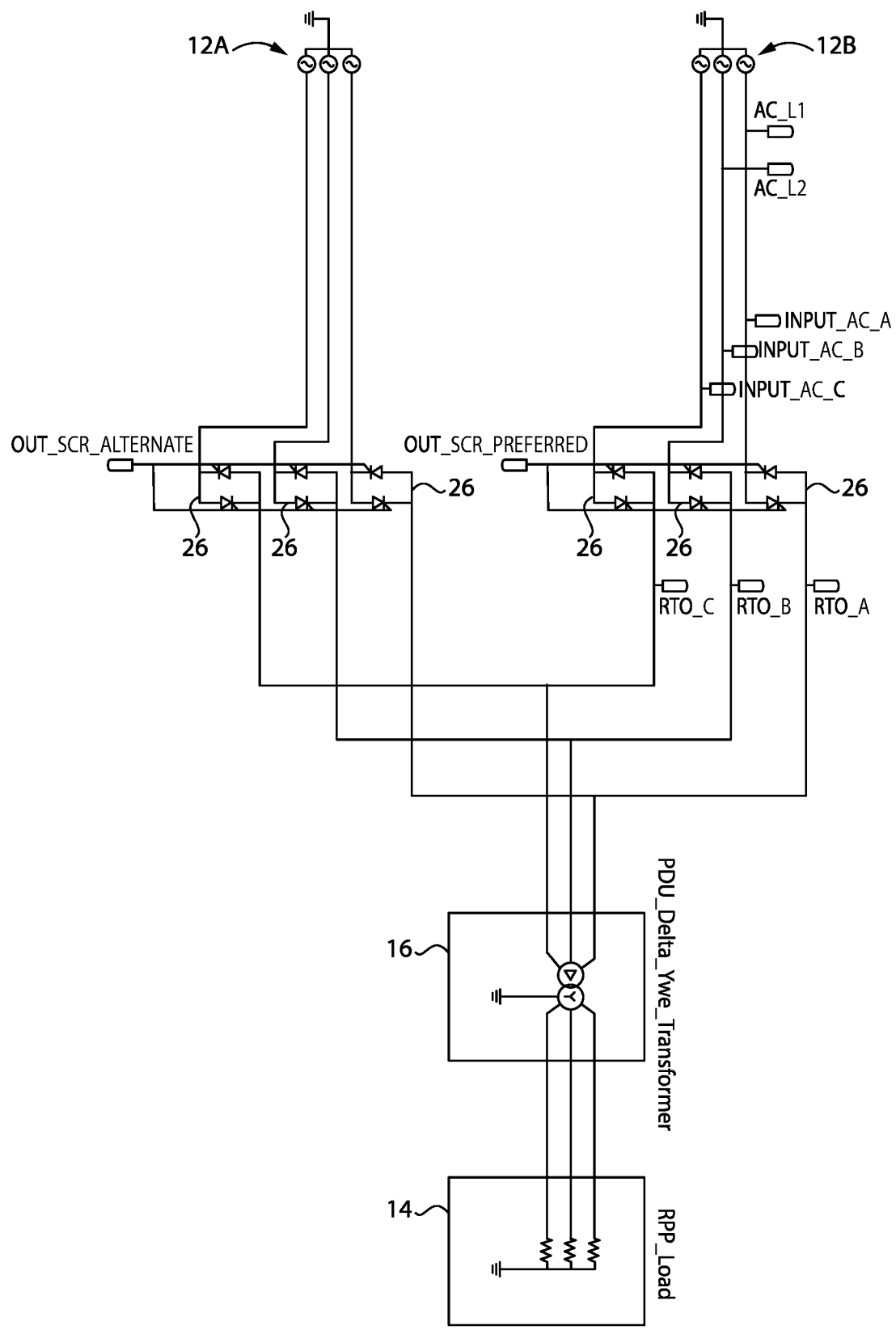
FIG. 6 is another schematic of the static transfer switch.

The main circuits 42 are shown in FIG. 6. The table below lists the names of the signals used in the main circuits 42 and the resonant circuits 44 of FIGS. 5-6. As explained below, a DSP 64 (FIGS. 2 and 8-9) may be used to generate the control signals used by the main circuits 42 and resonant circuits 44.

| Name | Function | Description |
| --- | --- | --- |
| INPUT_AC_A | Input | Phase A voltage sensing for PLL |
| INPUT_AC_B | Input | Phase B voltage sensing for PLL |
| INPUT_AC_C | Input | Phase C voltage sensing for PLL |
| IN_DC | Input | Bus voltage for the capacitor |
| OUT_RTO_PLUS_A | Output | Phase A positive RTO |
| OUT_RTO_MINUS_A | Output | Phase A negative RTO |
| OUT_RTO_PLUS_B | Output | Phase B positive RTO |
| OUT_RTO_MINUS_B | Output | Phase B negative RTO |
| OUT_RTO_PLUS_C | Output | Phase C positive RTO |
| OUT_RTO_MINUS_C | Output | Phase C negative RTO |
| OUT_PRECHARGE | Output | Pre-charge relay control signal |
| OUT_BLEEDER | Output | Bleeder relay control signal |
| OUT_SCR_PREFERRED | Output | Preferred side SCR gating signal |
| OUT_SCR_ALTERNATE | Output | Alternate side SCR gating signal |

Figure 7:
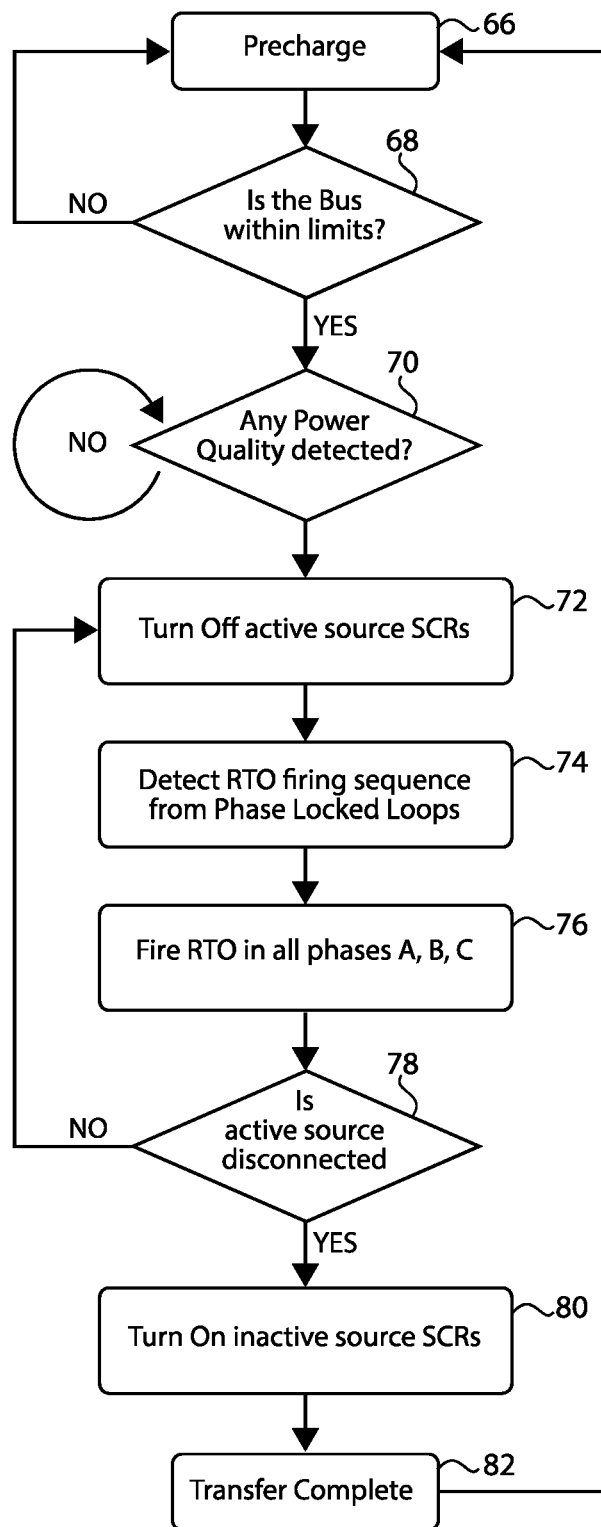
FIG. 7 is a flow chart showing a transfer of power from one power source to another power source to supply a load.

FIG. 7 shows a flowchart of the method of transferring the power supply for the load 14 from one power source 12A to another power source 12B in a static transfer switch 10. As understood, the method may be implemented by a controller 64, which may be in the form of a DSP 64. In steps 66-68, the energy storage (capacitors 36) are precharged by the charging circuit 46. The voltage of the DC bus 48 between the charging circuit 46 and the resonant circuits 44 is monitored and controlled to maintain a desired charge on the capacitors 36. That is, the relays 56, 58 are opened and closed as needed to supply voltage and bleed voltage to charge the capacitors 36. In step 70, the quality of the power being supplied by the power source 12A connected to the load 14 is monitored for degraded performance events. When such a situation is identified, the main switches 26 for the first power source 12A are opened to disconnect the first power source 12A from the load 14 in steps 72-78. That is, in step 72 turn off gate signals are sent to the main switches 26. The auxiliary switches 34 that must be turned on in each resonant circuit 44 are then determined in step 74 by phase locked loops 62 (see OUT_RTO_MINUS, OUT_RTO_PLUS algorithm above). The auxiliary switches 34 that have been determined in step 74 are then turned on with gate signals in step 76.

In step 78, the DSP 64 verifies that the preferred power source 12A is completely disconnected by confirming that the net value of the current and voltage passing through the main switches 22A, 26 for each phase of the preferred power source 12A is zero or negligible enough to confirm that the resonant circuits 44 did in fact reverse the bias for each of the main circuits 42. Finally, the DSP 64 can initiate a turn on command to the alternate power source 12B in step 80. Due to power quality considerations like inrush and soft start and preferred turn on conditions, it is possible to vary the method used to turn on the second power source 12B while still making use of the improved method of turning off the main switches 26 of the first power source 12A. After the main switches 22B, 26 for the alternate power source 12 have been turned on, the power transfer has been completed in step 82.

Figure 8:
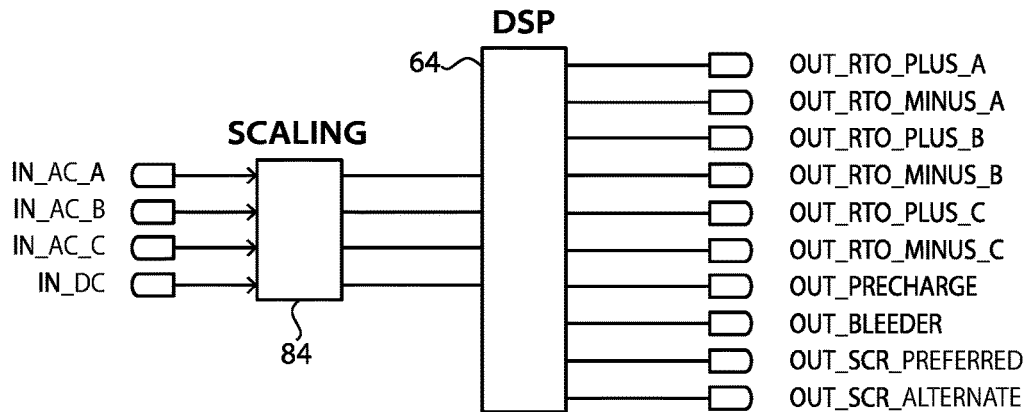
FIG. 8 is a schematic of a digital signal processor used for controlling power through the static transfer switch.
Figure 9:
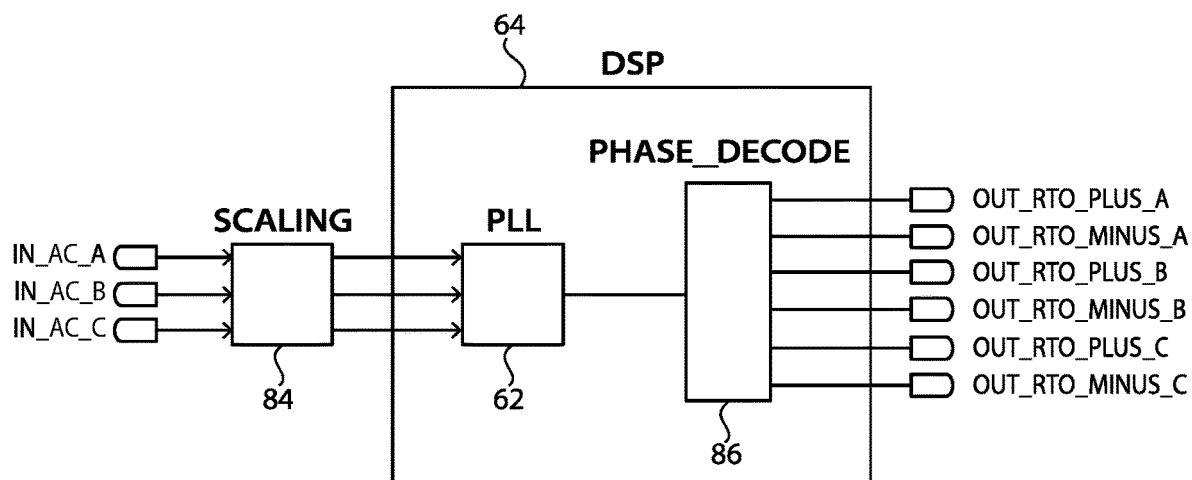
FIG. 9 is another schematic of a digital signal processor used for controlling power through the static transfer switch.

FIGS. 8-9 show a control system that may be used to control the resonant circuits 44, and associated charging circuit 46. It is understood that the control system may also be used to control the main circuits 42 as well. The Digital Signal Processor (DSP) 64 may be used to control all the relays, sense the voltages for the PLL synchronization and control the main switches 26, 42 and RTO thyristors 34, 44. As shown, a scaling processor 84 may be provided to adjust the inputs for use by the DSP 64. As also shown in FIG. 9, the DSP 64 may include a PLL element 62 and a phase decoder element 86 to evaluate the current direction of each phase and generate the gate signals for the auxiliary switches 34.

Static transfer switches 10 are designed to transfer power to a load 14 between a preferred electrical power source 12A and alternate electrical power source 12B in response to power source quality disturbances. Traditionally, thyristors 26 are commonly used in conventional static transfer switches 10 due to their high current handling capability. As a semi-controlled device, thyristors 26 cannot be turned off by simply removing the gate signal to the thyristor 26, because a thyristor 26 is turned off when the conduction current through the thyristor 26 commutates below its minimum holding current (usually less than 1 A) or the voltage applied to the thyristor 26 is reversed, which can be as long as half a cycle of the power source 12 fundamental frequency (e.g., 8.3 ms in 60 Hz AC systems). To speed up commutation of the thyristors 26, a resonant turn off (RTO) circuit 44 may be used as described above and below, where the resonant turn off circuit 44 is added in parallel to the thyristors 26. During thyristor 26 turn-off, a reverse current is injected by the resonant turn off circuit 44 to force the thyristor 26 current to commutate quickly to zero. In this way, the resonant turn off circuit 44 can interrupt the current within 1 ms, or preferably less than a half cycle of the power sources 12, which greatly shortens the disconnect time of the off going electrical power source 12. Typically, each phase A, B, C of each power source 12 has an individual resonant turn off circuit 44 in order to quickly turn off each phase during a transfer and to allow quick transfers back-and-forth in both directions between the power sources 12. Thus, six resonant turn off circuits 44 are required in for a two source static transfer switch 10. Likewise, nine resonant turn off circuits 44 would be needed in a three source static transfer switch 10.

Figures 10, 10A:
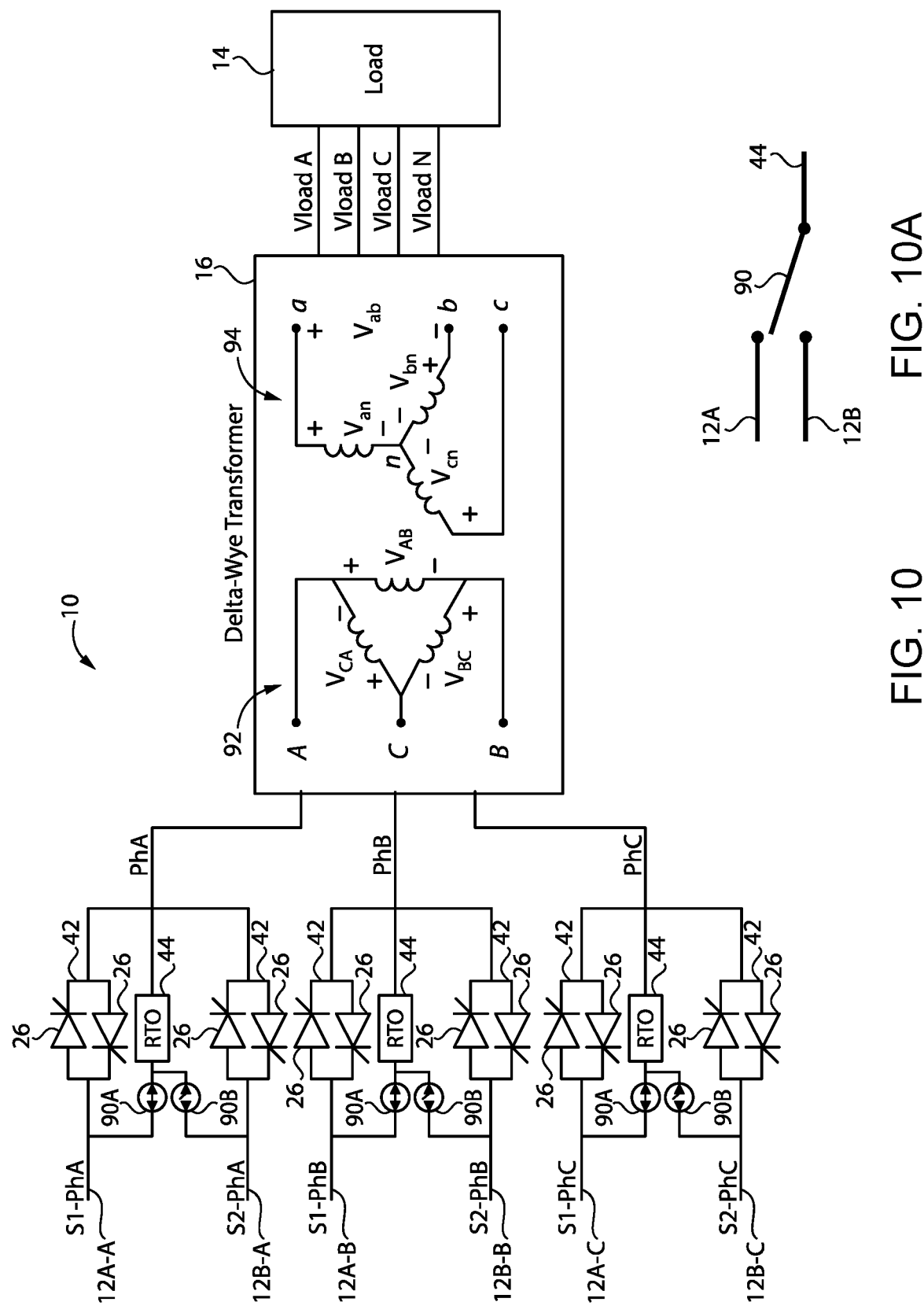
FIG. 10 is another schematic of a static transfer switch.
FIG. 10A is a schematic of a double throw switch.
Figure 11:
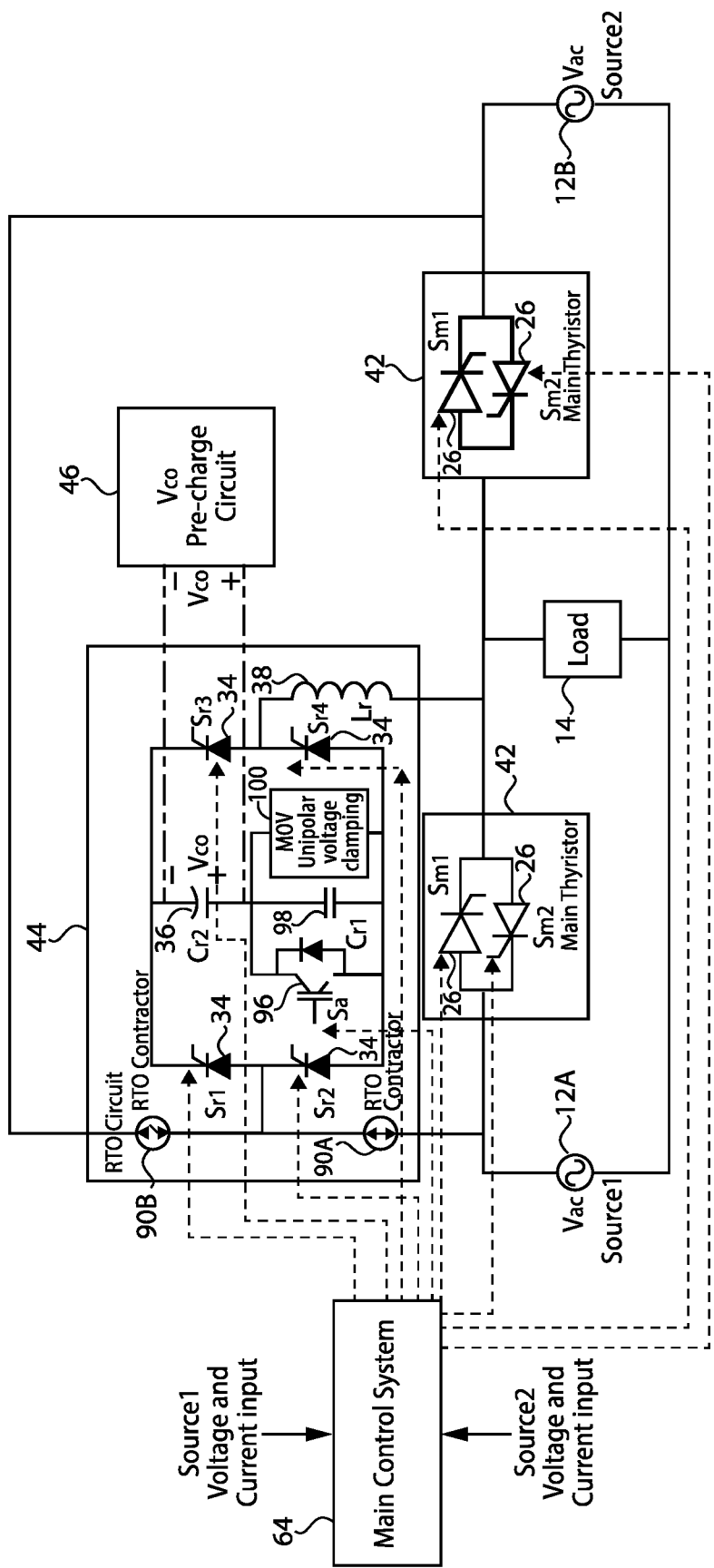
FIG. 11 is a schematic of a resonant turn off circuit shared between two main circuits.

As shown in FIGS. 10-11, the number of resonant turn off circuits 44 may be reduced by sharing the resonant turn off circuit 44 between the phases A, B, C of different power sources 12A, 12B. This may be useful in reducing the cost and complexity of the static transfer switch 10. As shown, an AC contactor or relay 90 may be used to select which power source 12A, 12B the resonant turn off circuit 44 is connected to. Various types of switches 90 (i.e., a fourth and fifth switch) may be used to connect the resonant turn off circuit 44 to a selected power source 12A, 12B, although an electro-mechanical switch 90 may be preferred due to the low cost, high capacity and reliability of such switches. Since the switching times of the contactors 90 is not critical because the contactors 90 are not directly involved in the actual switching event of turning off the thyristors 26A of one source 12A and turning on the thyristors 26B of the other source 12B, contactors 20 with slower switching times than the main thyristors 26A and/or the auxiliary thyristors 34 may be used. Although individual contactors 90A, 90B may be used, with each contactor 90A, 90B corresponding to one of the power sources 12A, 12B and one of the phases A, B, C, a single double throw switch 90 as shown in FIG. 10A may incorporate two switches 90A, 90B (i.e., the fourth and fifth switch) into one physical switch 90. In use, the contactors 90A, 90B connect the shared resonant turn off circuit 44 to the main circuit 42 of the power source 12A, 12B that is currently supplying power to the electrical load 14. As a result, the resonant turn off circuit 44 is connected to and prepared to quickly turn off current through the operating main circuit 42 when a power transfer switching event is initiated. For example, when the thyristors 26 of the first power source 12A are closed such that power is being supplied from the first power source 12A to the load 14, the first contactors 90A are closed to connect the shared resonant turn off circuits 44 to the first thyristors 26 and the second contactors 90B are open to disconnect the shared resonant turn off circuits 44 from the second thyristors 26. Conversely, when the thyristors 26 of the second power source 12B are closed such that power is being supplied from the second power source 12B to the load 14, the second contactors 90B are closed to connect the shared resonant turn off circuits 44 to the second thyristors 26 and the first contactors 90A are open to disconnect the shared resonant turn off circuits 44 from the second thyristors 26. As a result of the shared arrangement of the resonant turn off circuits 44, the number of resonant turn off circuits 44 can be reduced to three instead of six as required in a conventional two source static transfer switch 10. Similarly, in a three source system, the number of resonant turn off circuits 44 could be reduced from nine to three. The contactors 90 may also be useful in protecting the resonant turn off circuits 44 and/or isolating the circuits 44 during fault conditions (e.g., thyristor 26, 34 or IGBT 96 failures).

Figure 12:
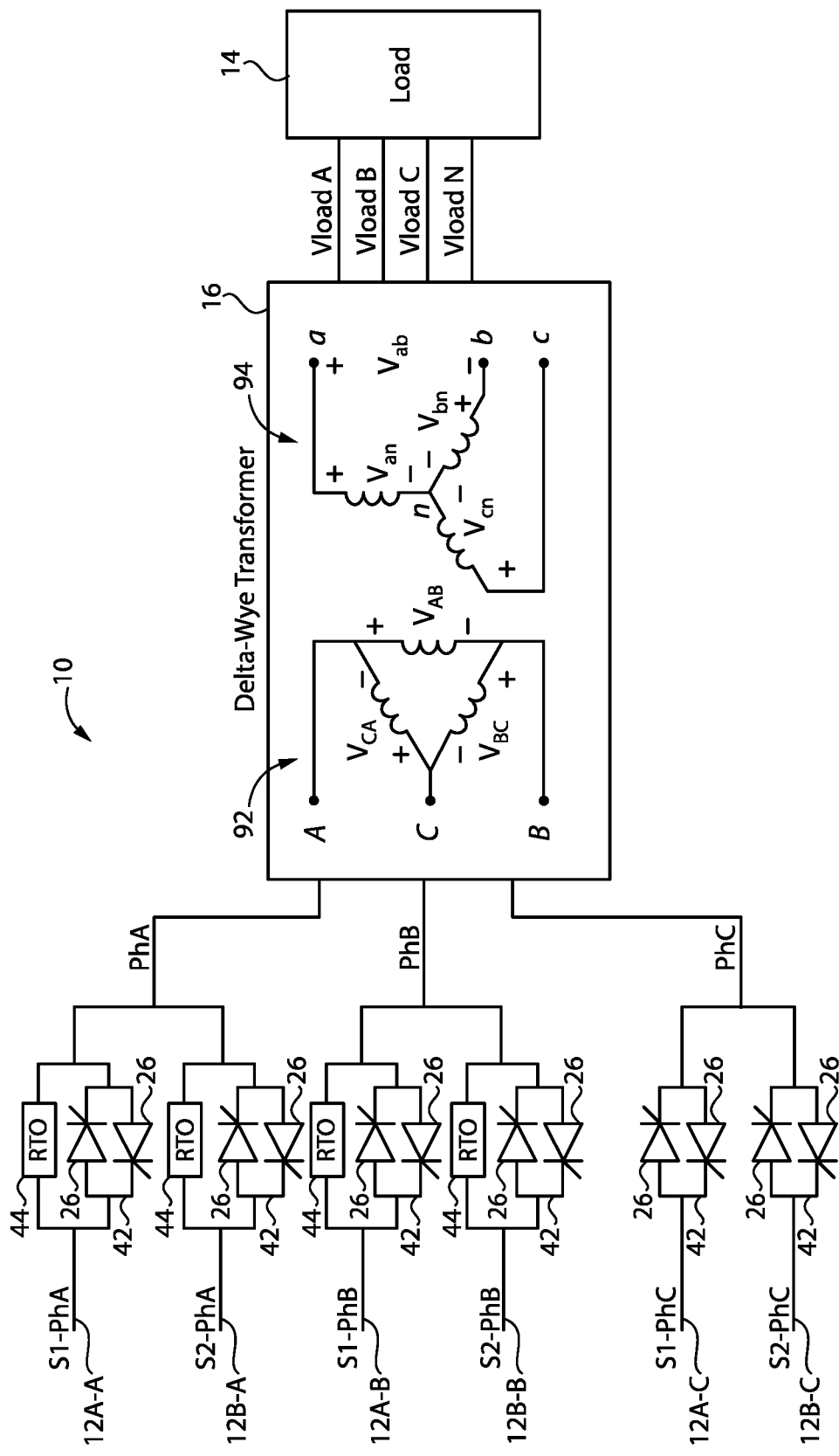
FIG. 12 is another schematic of a static transfer switch.

As shown in FIG. 12, the number of resonant turn off circuits 44 may also be reduced by eliminating the resonant turn off circuits 44 from one phase C of a three phase system. Thus, as shown resonant turn off circuits 44 may be directly connected to the main circuits 42 of two of the phases A, B. In this arrangement, when the two main circuits 42 are turned off with the respective resonant turn off circuits 44, current flow from the third phase C is also forced to zero automatically through the delta input side 92 of the transformer 16 between the main circuits 42 and the electrical load 14. For example, in a power transfer switching event where power is initially being supplied by the first power source 12A, the resonant turn off circuits 44 directly connected to the main circuits 42 for phases 12A-A and 12A-B (i.e., phases A & B of source 12A) are activated. This causes the respective main circuits 42 to open and phases 12A-A and 12A-B to be disconnected from the load 14. One or both of the two resonant turn off circuits 44 then force the remaining main circuit 42 for phase 12A-C to open through the delta side 92 of the transformer 14 which disconnect the remaining main circuit 42 from the load 14. Even though the third phase C may not have its own resonant turn off circuit 44, the current released by the two resonant turn off circuits 44 and the current conducted by all three main circuits 42 may cease flowing to the transformer 16 within 0.5 ms of the gate signals sent to the main circuits 42 or within less than half a cycle of the power source 12. The main circuits 42 for phases 12B-A, 12B-B, 12B-C are then closed to connect the second power source 12B to the load 14. Preferably, the two resonant turn off circuits 44 are activated at the same time by closing the corresponding auxiliary switches 34 at the same time such that current from both resonant turn off circuits 44 forces the remaining main circuit 42 to open through the delta side 92 of the transformer 16. Preferably, the output side of the transformer 16 is a wye side output 94. Thus, whereas a conventional static transfer switch 10 would have a separate resonant turn off circuit 44 for each phase A, B, C of a three-phase electrical power source 12, the present embodiment may be used to eliminate the resonant turn off circuit 44 from one of the phases C such that no resonant turn off circuit 44 is directly connected to the main circuit 42 of one phase C. As a result of the delta connected resonant turn off circuits 44, the number of resonant turn off circuits 44 can be reduced to four instead of six as required in a conventional two source static transfer switch 10. Similarly, in a three source system, the number of resonant turn off circuits 44 could be reduced from nine to six.

Figure 13:
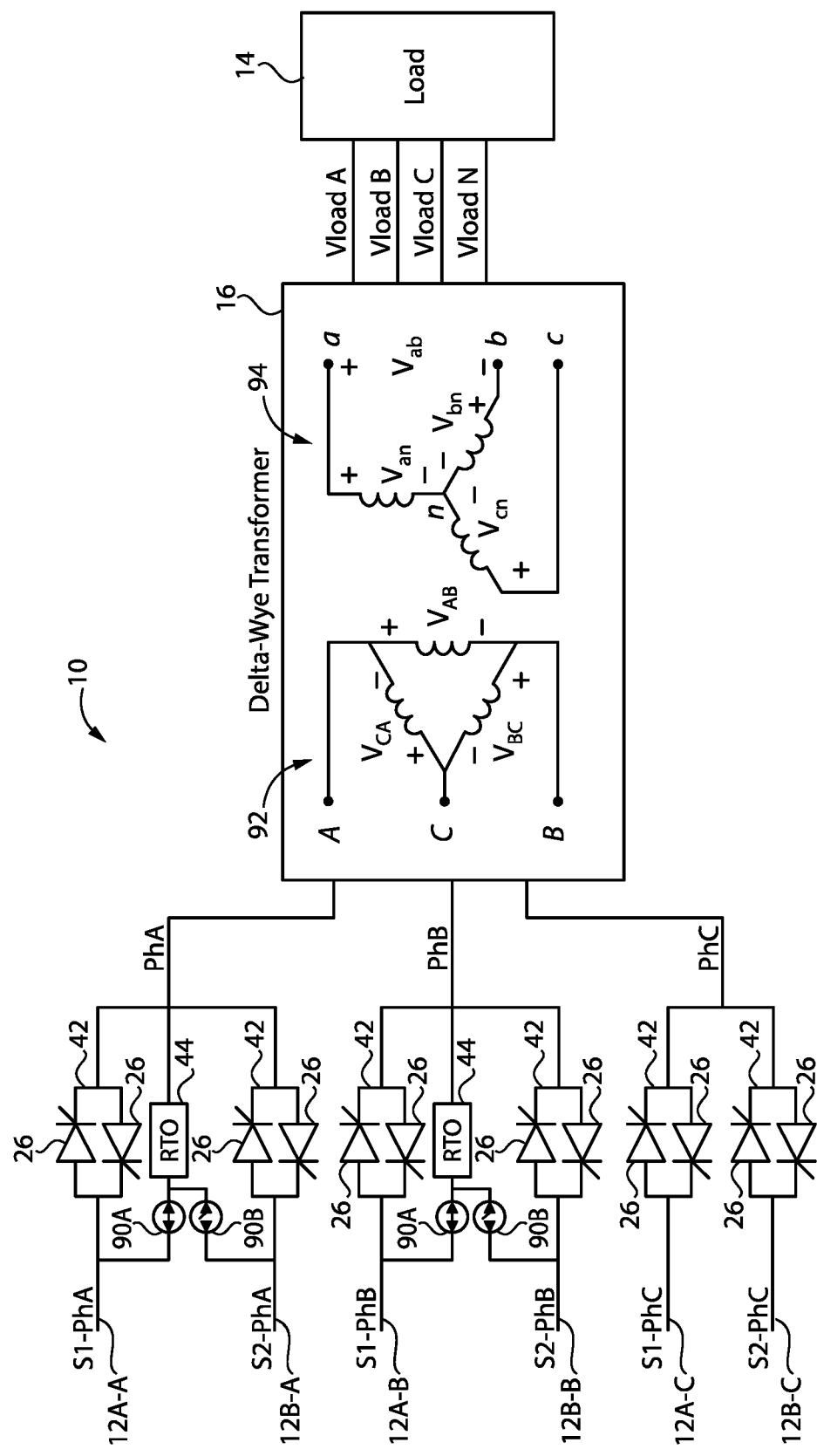
FIG. 13 is another schematic of a static transfer switch.

As shown in FIG. 13, the designs of FIGS. 10 and 12 may also be combined to reduce the number of resonant turn off circuits 44 even further. Thus, the static transfer switch 10 may have shared resonant transfer circuits 44 between two corresponding phases A, B of the power sources 12A, B and may have one phase C connected through the delta side 92 of the transformer 16 that does not have its own resonant transfer circuit 44. As a result, the number of resonant turn off circuits 44 may be reduced from six to two in a two source system and from nine to two in a three source system.

Figure 14A:
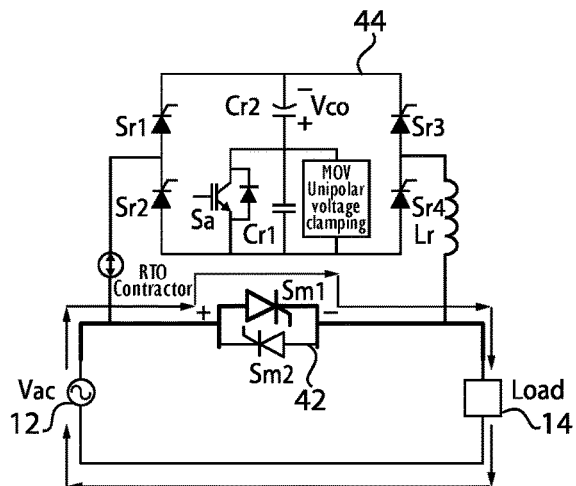
FIGS. 14A-E are schematics of the operation of a resonant turn off circuit.
Figure 14B:
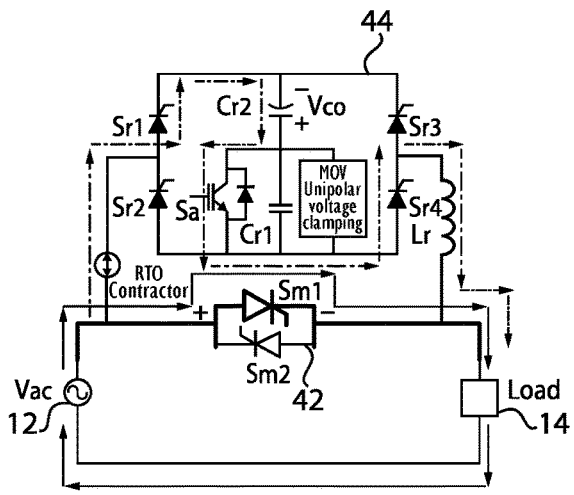
Figure 14C:
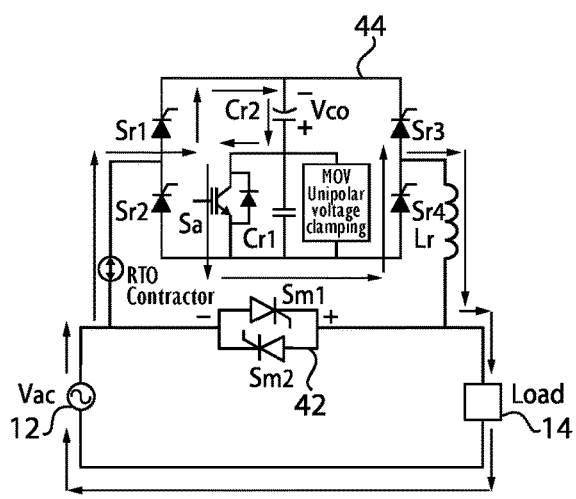
Figure 14D:
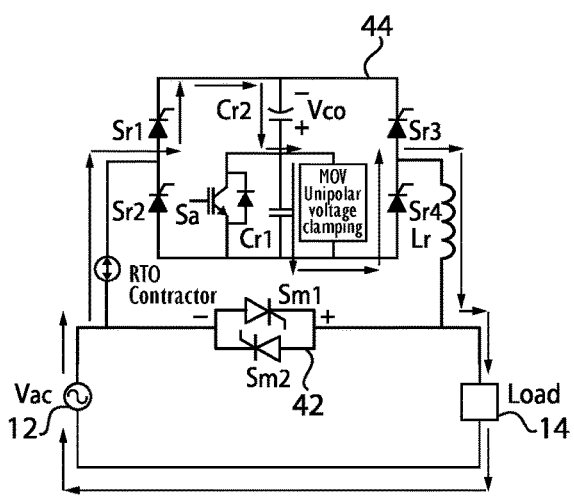
Figure 14E:
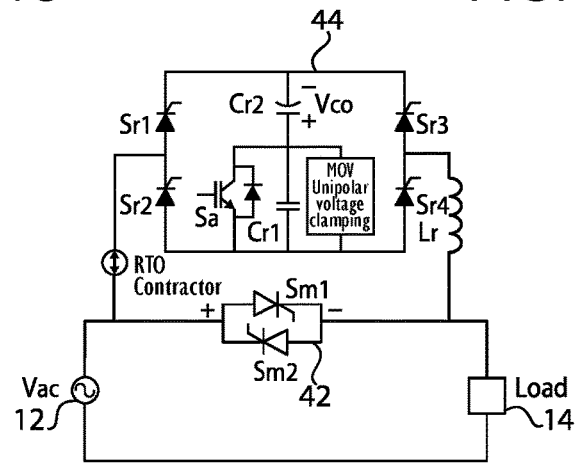
Figure 15:
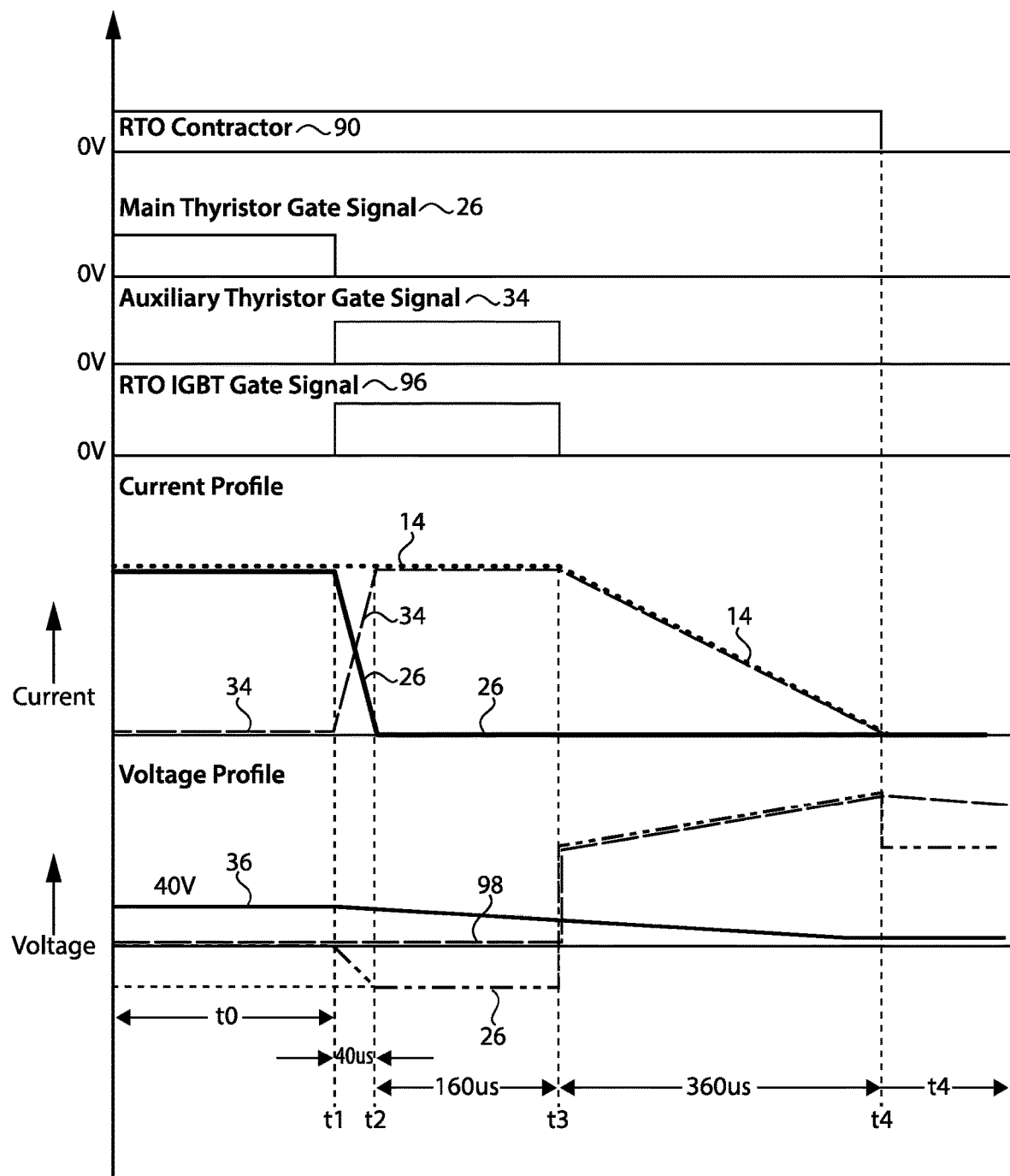
FIG. 15 is a series of graphs showing electrical properties of the switch circuit of FIGS. 14A-E.

The operation of the resonant turn off circuit 44 of FIG. 11 is illustrated in FIGS. 14A-E (refer to FIG. 11 for detailed reference numbers), and the voltage and current is shown in FIG. 15. It is understood, however, that any type of resonant turn off circuit 44 may be used including the resonant turn off circuit 44 of FIGS. 3 and 5. The capacitor 36 may be pre-charged to a relatively low voltage (40-50 V) and provides a resonant current to create a zero-current crossing for main circuit 42. A pre-charge circuit 46 may be provided for pre-charging the capacitor 36. The resonant inductor 38 limits the change in current to provide a softer commutation. As shown in FIG. 14A, before t1, the main thyristors 26 conduct current to the load 14. In FIG. 14B, at t1, when a switching event is initiated, the gate signal to at least one of the main thyristors 42 is turned off, depending on the load current direction, and the corresponding auxiliary thyristors 34 and the IGBT 96 are closed with a gate signal. For example, in FIG. 4(*a*), $S_{m1}$ conducts the load current. From t1 to t2, in FIG. 14B, load current is forced to commutate from the main thyristor 26 to the resonant turn off circuit 44. In FIG. 14C, at t2, reversed bias voltage from the capacitor 36 is applied to the anode of the main thyristor 26 to speed up its turn-off. As shown in FIG. 15, the capacitor 36 discharges and voltage of the capacitor 36 drops during this period. The energy stored in the capacitor 36 is preferably large enough to maintain the voltage polarity and reverse the bias to the main thyristor 26. The period between t2 and t3 allows sufficient time for the main thyristor 26 to commutate. In FIG. 14D, at t3, the main thyristor 26 is completely blocks forward voltage, and the auxiliary thyristors 34 and IGBT 96 are commanded to turn-off. From t3 to t4, in FIG. 14D, the voltage of the resonant capacitor 98 increases until reaching the clamping voltage. In FIG. 14E, loop energy has been absorbed by the snubber circuit 100, and the load current is zero and has been completely interrupted at t4. It is understood that a variety of resonant turn off circuits 44 may be used herein, with additional examples being provided in U.S. patent application Ser. No. 16/795,988, which is incorporated by reference herein.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A static transfer switch, comprising:
   a first electrical power source;
   a second electrical power source;
   an electrical load;
   a first switch between the first electrical power source and the electrical load;
   a second switch between the second electrical power source and the electrical load;
   a resonant turn off circuit;
   a fourth switch between the resonant turn off circuit and the first switch;
   a fifth switch between the resonant turn off circuit and the second switch;
   wherein the fourth switch is closed to connect the resonant turn off circuit to the first switch when the first switch is closed and connecting the first electrical power source to the electrical load; and
   wherein the fifth switch is closed to connect the resonant turn off circuit to the second switch when the second switch is closed and connecting the second electrical power source to the electrical load.

2. The static transfer switch according to claim 1, wherein the fourth and fifth switches have slower switching times than the first and second switches.

3. The static transfer switch according to claim 1, wherein the fourth and fifth switches are electro-mechanical switches.

4. The static transfer switch according to claim 1, wherein the resonant turn off circuit comprises an energy storage and a third switch, the third switch being closed during a switching event to connect the energy storage to one of the first and second switches in order to force the one of the first and second switches to open.

5. The static transfer switch according to claim 4, wherein the third switch comprises a thyristor.

6. The static transfer switch according to claim 4, wherein the third switch comprises two third switches, wherein the two third switches being coupled to the first switch and the second switch, one of the two third switches being coupled to inputs of the first and second switches and another of the two third switches being coupled to outputs of the first and second switches, the energy storage being disposed between the two third switches.

7. The static transfer switch according to claim 4, wherein the third switch comprises two third switches, wherein the two third switches being coupled to the first switch and the second switch, the two third switches both being disposed between the energy storage and inputs or outputs of the first and second switches, wherein one of the two third switches is closed if a positive current is being conducted through the first or second switch and another of the two third switches is closed if a negative current is being conducted through the first or second switch.

8. The static transfer switch according to claim 4, wherein the third switch comprises four third switches, wherein the four third switches being coupled to the first switch and the second switch, two of the third switches being coupled to inputs of the first and second switches and two of the third switches being coupled to outputs of the first and second switches, the energy storage being disposed between two of the third switches on one side and two of the third switches on another side, wherein two of the third switches on opposite sides of the energy storage are closed if a positive current is being conducted through the first or second switch, and a different two of the third switches on opposite sides of the energy storage are closed if a negative current is being conducted through the first or second switch.

9. The static transfer switch according to claim 4, further comprising an inductor coupled between inputs or outputs of the first and second switches and the third switch.

10. The static transfer switch according to claim 4, wherein the energy storage is a capacitor.

11. The static transfer switch according to claim 4, further comprising a charge circuit to maintain a predetermined charge of the energy storage.

12. The static transfer switch according to claim 1, wherein a current released by the resonant turn off circuit and a current conducted through the first switch and the second switch ceases to flow to the electrical load within 0.5 ms of turning off a gate signal to the first switch and the second switch during respective switching events.

13. The static transfer switch according to claim 1, wherein the fourth and fifth switches comprise a double throw switch.

14. The static transfer switch according to claim 1, wherein the resonant turn off circuit forces the first and second switches to open in less than one half an electrical cycle of the first and second electrical power sources, respectively.

15. The static transfer switch according to claim 1, wherein the first and second switches comprise silicon controlled rectifiers.

16. The static transfer switch according to claim 1, wherein the first and second switches comprise integrated gate-commutated thyristors (IGCT), reverse blocking integrated gate-commutated thyristors (IGCT), or gate turn-off thyristors (GTO).

17. The static transfer switch according to claim 1, further comprising a transformer between the first and second switches and the electrical load.

18. The static transfer switch according to claim 1, wherein the electrical load comprises a data center.

19. The static transfer switch according to claim 1, wherein one of the first and second electrical power sources comprises an uninterruptible power supply (UPS).

20. A static transfer switch, comprising:
   a set of first power inputs coupled to a first three-phase electrical power source, each first power input of the set of first power inputs being coupled to one phase of the first three-phase electrical power source;
   a set of second power inputs coupled to a second three-phase electrical power source, each second power input of the second set of power inputs being coupled to one phase of the second three-phase electrical power source;

a set of power outputs coupled to a three-phase electrical load, each power output of the set of power outputs being coupled to one phase of the three-phase electrical load;

a set of first switches coupled between the set of first power inputs and the set of power outputs;

a set of second switches coupled between the set of second power inputs and the set of power outputs;

a set of third switches coupled between a set of energy storages and the set of first switches and coupled between the set of energy storages and the set of second switches, each third switch of the set of third switches being coupled between one of the energy storages and a respective first switch of the set of first switches and a respective second switch of the set of second switches;

a set of fourth switches coupled between the set of third switches and the set of first switches, each fourth switch of the set of fourth switches being coupled between a respective third switch of the set of third switches and a respective first switch of the set of first switches;

a set of fifth switches coupled between the set of third switches and the set of second switches, each fifth switch of the set of fifth switches being coupled between a respective third switch of the set of third switches and a respective second switch of the set of second switches;

a sensor to determine an electrical property of the first three-phase electrical power source;

a power transfer controller, the sensor being an input to the power transfer controller and the sets of first and second switches being outputs of the power transfer controller;

wherein during normal operation, the power transfer controller closes the set of first switches or the set of second switches to electrically connect the set of first power inputs or the set of second power inputs, respectively, to the set of power outputs, and opens the other of the set of first switches or the set of second switches to electrically disconnect the set of first power inputs or the set of second power inputs, respectively, from the set of power outputs, wherein the first three-phase electrical power source or the second three-phase electrical power source, respectively, thereby supplying power to the three-phase electrical load; and wherein during normal operation, the set of fourth switches remain closed and the set of fifth switches remain open when the first set of switches are closed and the fifth set of switches remain closed, and the fourth set of switches remain open when the second set of switches are closed;

wherein when the sensor identifies degraded performance of the first or second three-phase electrical power source connected to the three-phase electrical load, and the power transfer controller initiates a switching event, comprising:

turning off a gate signal to each of the first switches of the set of first switches or the second switches of the set of second switches which are closed during normal operation;

closing at least one third switch of the set of third switches between each first and second switches of the first set of switches and the second set of switches and each respective energy storage after the gate signal of the respective first switch or second switch of the first set of switches and the second set of switches has been turned off, the set of energy storages thereby releasing a current to an input or an output of the respective first switch or second switch of the first set of switches and the second set of switches to force a drop in current conducted through the respective first switch or second switch of the first set of switches and the second set of switches, the drop in current causing the respective first switch or second switch of the first set of switches and the second set of switches to open and stop conducting current therethrough between the respective first or second three-phase electrical power source and the three-phase electrical load;

closing the other set of first or second switches to supply power from the other of the first or second three-phase electrical power source to the three-phase electrical load; and after the first and second set of switches are opened and closed, opening the set of fourth switches and closing the set of fifth switches when the first set of switches are opened and the second set of switches are closed during the switching event, and opening the set of fifth switches and closing the set of fourth switches when the second set of switches are opened and the first set of switches are closed during the switching event.

\* \* \* \* \*